(12) United States Patent
Jeong et al.

(10) Patent No.: US 12,666,655 B2
(45) Date of Patent: Jun. 23, 2026

(54) METHOD FOR MANUFACTURING TELLURIUM-BASED SEMICONDUCTOR DEVICE, TELLURIUM-BASED SEMICONDUCTOR DEVICE MANUFACTURED THEREBY, AND THIN FILM TRANSISTOR

(71) Applicant: IUCF-HYU (INDUSTRY-UNIVERSITY COOPERATION FOUNDATION HANYANG UNIVERSITY), Seoul (KR)

(72) Inventors: Jae Kyeong Jeong, Seoul (KR); Tai Kyu Kim, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 608 days.

(21) Appl. No.: 18/020,547

(22) PCT Filed: Jul. 6, 2021

(86) PCT No.: PCT/KR2021/008558
§ 371 (c)(1),
(2) Date: Feb. 9, 2023

(87) PCT Pub. No.: WO2022/045568
PCT Pub. Date: Mar. 3, 2022

(65) Prior Publication Data
US 2023/0352596 A1 Nov. 2, 2023

(30) Foreign Application Priority Data
Aug. 25, 2020 (KR) ........................ 10-2020-0107361

(51) Int. Cl.
*H10D 30/67* (2025.01)
*H10D 62/40* (2025.01)
(Continued)

(52) U.S. Cl.
CPC ........... *H10D 30/675* (2025.01); *H10D 62/40* (2025.01); *H10D 62/402* (2025.01); *H10D 62/80* (2025.01);
(Continued)

(58) Field of Classification Search
CPC ...... H10D 30/675; H10D 62/84; H10D 62/86; H10D 62/40; H10D 62/402; H10D 62/80;
(Continued)

(56) References Cited

U.S. PATENT DOCUMENTS

| | | | |
|---|---|---|---|
| 6,391,395 B1 | 5/2002 | Tseng et al. | |
| 2011/0113859 A1* | 5/2011 | Anthopoulos | ..... H10D 30/6739 257/E21.409 |
| 2013/0187164 A1* | 7/2013 | Oshima | .............. H10D 30/6756 438/158 |

FOREIGN PATENT DOCUMENTS

| | | |
|---|---|---|
| JP | 2017-152708 A | 8/2017 |
| KR | 10-2009-0079035 A | 7/2009 |

(Continued)

OTHER PUBLICATIONS

M F Al-Kuhaili et al 2002 J. Phys. D: Appl. Phys. 35 910 (Year: 2002).*

(Continued)

*Primary Examiner* — Julio J Maldonado
*Assistant Examiner* — Paul A Berry
(74) *Attorney, Agent, or Firm* — Sughrue Mion, PLLC

(57) ABSTRACT
A method for manufacturing a tellurium-based semiconductor device comprises the steps of: preparing a substrate; depositing, on the substrate, a tellurium-based semiconduc-
(Continued)

tor material including tellurium and a tellurium oxide so as to form a tellurium-based semiconductor layer; and forming a passivation layer on the tellurium-based semiconductor layer. According to the manufacturing method, heat treatment at a high temperature or cryogenic conditions are not required, and thus, it is possible to manufacture a semiconductor device through a practical process. In addition, since the crystallinity of the tellurium-based semiconductor layer is improved during the manufacturing process, it is possible to provide a p-type semiconductor device having excellent electrical characteristics such as electric field mobility and a current blink ratio.

14 Claims, 8 Drawing Sheets

(51) Int. Cl.

| | | |
|---|---|---|
| *H10D 62/80* | (2025.01) | |
| *H10D 62/84* | (2025.01) | |
| *H10D 62/86* | (2025.01) | |
| *H10D 99/00* | (2025.01) | |
| *H10P 14/20* | (2026.01) | |
| *H10P 14/22* | (2026.01) | |
| *H10W 74/10* | (2026.01) | |
| *H10W 74/43* | (2026.01) | |

(52) U.S. Cl.
CPC ............. *H10D 62/84* (2025.01); *H10D 62/86* (2025.01); *H10D 99/00* (2025.01); *H10P 14/22* (2026.01); *H10P 14/2905* (2026.01); *H10P 14/3238* (2026.01); *H10P 14/3402* (2026.01); *H10P 14/3452* (2026.01); *H10P 14/3802* (2026.01); *H10W 74/137* (2026.01); *H10W 74/43* (2026.01)

(58) Field of Classification Search
CPC ............... H10D 99/00; H10D 30/6741; H10D 30/6755–6756; H10D 30/67; H01L 21/02562; H01L 21/02568; H01L 21/02631; H01L 21/02667; H01L 23/3171; H01L 21/0257; H01L 21/02; H01L 21/02381; H01L 21/02488; H01L 21/02521; H01L 21/0259; H01L 23/291; H01L 21/02422; H01L 21/02565; H10P 14/3432; H10P 14/3436; H10P 14/3438; H10P 14/3434
See application file for complete search history.

(56) References Cited

FOREIGN PATENT DOCUMENTS

| | | | |
|---|---|---|---|
| KR | 10-2011-0107130 A | 9/2011 | |
| KR | 10-2013-0077116 A | 7/2013 | |
| KR | 10-2015-0108168 A | 9/2015 | |
| KR | 10-2016-0009500 A | 1/2016 | |
| KR | 10-2017-0098053 A | 8/2017 | |

OTHER PUBLICATIONS

Takafumi Kawaguchi et al 1986 Jpn. J. Appl. Phys. 25 449 (Year: 1986).*
S. Santucci, S. Di Nardo, L. Lozzi, M. Passacantando, P. Picozzi, XPS, Leed and AFM investigation of the Si(100) surface after the deposition and annealing of tellurium thin films, Surface Science, vols. 352â354, 1996, pp. 1027-1032, ISSN 0039-6028 (Year: 1996).*
Zhao, C., Tan, C., Lien, DH. et al. Evaporated tellurium thin films for p-type field-effect transistors and circuits. Nat. Nanotechnol. 15, 53â58 (2020) (Year: 2020).*
Takafumi Kawaguchi et al, "A Novel Method of Fabricating Te Thin Film Transistors", 1986 Jpn. J. Appl. Phys. 25 449 (Year: 1986).*
M F Al-Kuhaili et al, "Effects of preparation conditions on the optical properties of thin films of tellurium oxide", 2002 J. Phys. D: Appl Phys. 35 910 (Year: 2002).*
Zhao, C., Tan, C., Lien, DH. et al. "Evaporated tellurium thin films for p-type field-effect transistors and circuits". Nat. Nanotechnol. 15, 53-58 (2020) (Year: 2020).*
S. Santucci, S. Di Nardo, L. Lozzi, M. Passacantando, P. Picozzi, "XPS, Leed and AFM investigation of the Si(100) surface after the deposition and annealing of tellurium thin films", Surface Science, vols. 352-354, 1996, pp. 1027-1032 (Year: 1996).*
Demiryont, Hulya, L. R. Thompson, and G. J. Collins. "Optical properties of aluminum oxynitrides deposited by laser-assisted CVD" Applied optics 25.8 (1986): 1311-1318 (Year: 1986).*
Chunsong Zhao et al., "Evaporated tellurium thin films for p-type field-effect transistors and circuits", Nature Nanotechnology, Jan. 2020, pp. 53-58, vol. 15.
International Search Report for PCT/KR2021/008558 dated, Oct. 13, 2021 (PCT/ISA/210).
Korean Office Action issued May 12, 2023, for Application No. 10-2020-0107361.

* cited by examiner (a) As-deposited Te sample (b) 150°C-annealed sample w/o $Al_2O_3$ (c) 150°C-annealed sample w/ $Al_2O_3$ (a) 150°C-annealed sample w/o $Al_2O_3$ (b) 150°C-annealed sample w/ $Al_2O_3$ (a) 150°C-annealed sample w/o Al$_2$O$_3$ (b) 150°C-annealed sample w/ Al$_2$O$_3$ (a) As-deposited Te sample (b) 150°C-annealed sample w/o $Al_2O_3$ (c) 150°C-annealed sample w/ $Al_2O_3$

METHOD FOR MANUFACTURING TELLURIUM-BASED SEMICONDUCTOR DEVICE, TELLURIUM-BASED SEMICONDUCTOR DEVICE MANUFACTURED THEREBY, AND THIN FILM TRANSISTOR

CROSS REFERENCE TO RELATED APPLICATIONS

This application is a National Stage of International Application No. PCT/KR2021/008558 filed Jul. 6, 2021, claiming priority based on Korean Patent Application No. 10-2020-0107361 filed Aug. 25, 2020, the disclosure of which is incorporated herein by reference in its entirety.

TECHNICAL FIELD

The present invention relates to a method for manufacturing a tellurium-based semiconductor device, a tellurium-based semiconductor device manufactured thereby, and a thin film transistor comprising the same, and more particularly, to a method for manufacturing a p-type tellurium-based semiconductor device with excellent electrical properties through a practical process, a tellurium-based semiconductor device manufactured by the method, and a thin film transistor comprising the tellurium-based semiconductor device.

BACKGROUND ART

A transistor is a device used to amplify or switch electron signals and power by using semiconductors, and is widely used in various electronic devices such as displays and speakers. Semiconductors used in these transistors have achieved improved integration through downsizing of unit devices, but as a technology node of semiconductors develops into a 10 nm band, the downsizing has reached a technical limit. Accordingly, as a technology for overcoming the limitation, a so-called three-dimensional semiconductor technology capable of improving a degree of integration of semiconductors by stacking two-dimensional semiconductors in several layers and implementing them in a three-dimensional form has been proposed.

However, since silicon-based semiconductors, which are the most generally-used semiconductor materials, require high-temperature heat treatment during manufacturing, it is difficult to form them on substrates with low heat resistance and difficult to apply to 3D semiconductor technology. In addition, there is also a limit of low electric field mobility. Accordingly, various alternative materials are being developed to compensate for the drawbacks of these silicon-based semiconductors.

As one of the alternatives to the silicon-based semiconductors, oxide semiconductors such as a zinc oxide (ZnO), an indium zinc oxide (IZO), and an indium gallium zinc oxide (IGZO) are being used. In the case of such an oxide semiconductor, it can be manufactured at a lower temperature than the silicon-based semiconductor, so that it can be applied to the implementation of 3D semiconductor technology. In addition, the oxide semiconductor is suitable for transparent electronic devices due to its high visible light transmittance, and it has high energy band gap and electric field mobility. However, such an oxide semiconductor mainly has characteristics of an n-type semiconductor, and when used as a p-type semiconductor, it is difficult to obtain uniform quality and electrical characteristics such as electric field mobility and a current on/off ratio are poor.

For example, Korean Patent Laid-open Publication No. 10-2015-0108168 describes a p-type oxide semiconductor in which Ga is additionally bonded to CuS, SnO, ITO, IZTO, IGZO, IZO, etc., and it is disclosed that such a p-type oxide semiconductor may be easily manufactured by a solution process and may implement a high-performance thin film transistor with high mobility. However, since the above technology uses the solution process, there is a problem of poor semiconductor line affinity, and since a heat treatment process at a high temperature of 300° C. or more is required to improve the mobility of the thin film transistor, there is a limit to the application of 3D semiconductor technology.

As an alternative to this, research on using tellurium as a material for the p-type semiconductor is being conducted. Tellurium (Te) is a metalloid element with element number 52, and has an electronic arrangement of $4d^{10} 5s^2 5p^4$, and its crystal has a hexagonal structure. Tellurium has excellent characteristics in terms of high bandgap energy and high hole mobility, but it is difficult to deposit on a large area and lacks switching characteristics when applied to transistors. In order to overcome this problem, in the document [Chunsong Zhao et al., *Nature Nanotechnology*, Volume 15, Pages 53 to 58 (2020)], a method using thermal evaporation is described as a technology for depositing ultra-thin tellurium thin films on various substrates such as a silicon integrated circuit, glass, and plastics. However, in the above technology, since a tellurium thin film is deposited at a cryogenic temperature of −80° C., practicality is poor.

In this situation, the inventors of the present invention have found that, through a method of depositing a tellurium-based semiconductor material comprising tellurium and tellurium oxide on a substrate and then depositing a passivation layer thereon, a p-type semiconductor with excellent electrical characteristics can be manufactured by a practical process without heat treatment at high temperatures, and the present invention has been completed.

DISCLOSURE

Technical Problem

An object of the present invention is to provide a method for manufacturing a p-type tellurium-based semiconductor device having high crystallinity and excellent electrical characteristics.

Another object of the present invention is to provide a tellurium-based semiconductor device manufactured by the method.

Still another object of the present invention is to provide a thin film transistor comprising the tellurium-based semiconductor device.

Technical Solution

In order to achieve the object, the present invention provides a method for manufacturing a tellurium-based semiconductor device, comprising: (i) preparing a substrate: (ii) depositing a tellurium-based semiconductor layer comprising one or more of tellurium and a tellurium oxide on the substrate; and (iii) forming a passivation layer on the tellurium-based semiconductor layer.

In the method of the present invention, the substrate may further comprise an insulating layer thereon.

In the present invention, the tellurium-based semiconductor layer may comprise Te and $TeO_2$.

In the present invention, the tellurium-based semiconductor layer may further comprise at least one metal selected from the group consisting of Sn, Al, Sb, Hf, La, Y, Zr, and Zn as a dopant or in the form of alloy.

In the present invention, the deposition of the tellurium-based semiconductor layer may be performed by sputtering, chemical vapor deposition, thermal vacuum deposition, electron beam deposition, or atomic layer deposition.

In the present invention, the deposition of the tellurium-based semiconductor layer is preferably performed under an oxygen partial pressure condition of 5 to 15%.

In the present invention, a thickness of the tellurium-based semiconductor layer is preferably 2 to 7 nm.

The manufacturing method of the present invention may further comprise, after the step (ii), performing heat treatment at 100 to 200° C.

In the present invention, the passivation layer preferably comprises at least one selected from the group consisting of $Al_2O_3$, $HfO_2$, $ZrO_2$, $Ta_2O_5$, $La_2O_3$, $Y_2O_3$, $AlHfO_x$, $HfZrO_x$, and $AlZrO_x$.

In the present invention, the formation of the passivation layer is preferably performed by atomic layer deposition, chemical vapor deposition, thermal vacuum deposition, sputtering, or electron beam deposition.

In the present invention, the formation of the passivation layer is preferably performed at a temperature of 100 to 200° C.

In the present invention, a thickness of the passivation layer is preferably 1 to 30 nm.

The present invention also provides a tellurium-based semiconductor device that is manufactured by the method, comprising: a substrate; a tellurium-based semiconductor layer positioned on the substrate; and a passivation layer positioned on the tellurium-based semiconductor layer.

In the tellurium-based semiconductor device of the present invention, the tellurium-based semiconductor layer preferably comprises Te and $Te^{4+}$ at an atomic ratio of 80:20 to 90:10.

The present invention also provides a thin film transistor comprising the tellurium-based semiconductor device.

Advantageous Effects

According to the manufacturing method of the present invention, a tellurium-based p-type semiconductor device having excellent electrical characteristics may be manufactured by a practical process that does not require high-temperature heat treatment or cryogenic conditions. In addition, the crystallinity of the tellurium-based semiconductor layer is improved during the manufacturing process, it is possible to provide a p-type semiconductor device and a thin film transistor having excellent electrical characteristics such as electric field mobility and a current on/off ratio.

DESCRIPTION OF THE DRAWINGS

FIG. 3A shows a TEM image of an as-deposited tellurium-based semiconductor layer before heat treatment, FIG. 3B shows a TEM image of a tellurium-based semiconductor layer after heat treatment, and FIG. 3C shows a TEM image of a tellurium-based semiconductor layer after forming a passivation layer thereon.

FIG. 4A shows a transmission characteristic of the tellurium-based semiconductor having no passivation layer and FIG. 4B shows a transmission characteristic of the tellurium-based semiconductor having the passivation layer.

FIG. 5A shows a transmission characteristic of the tellurium-based semiconductor having no passivation layer and FIG. 5B shows a transmission characteristic of the tellurium-based semiconductor having the passivation layer.

FIG. 6A shows an XRD result an as-deposited tellurium-based semiconductor layer before heat treatment, FIG. 6B shows an XRD result of a tellurium-based semiconductor layer after heat treatment, and FIG. 6C shows an XRD result of a tellurium-based semiconductor layer after forming a passivation layer thereon.

MODE FOR INVENTION

Figure 1:
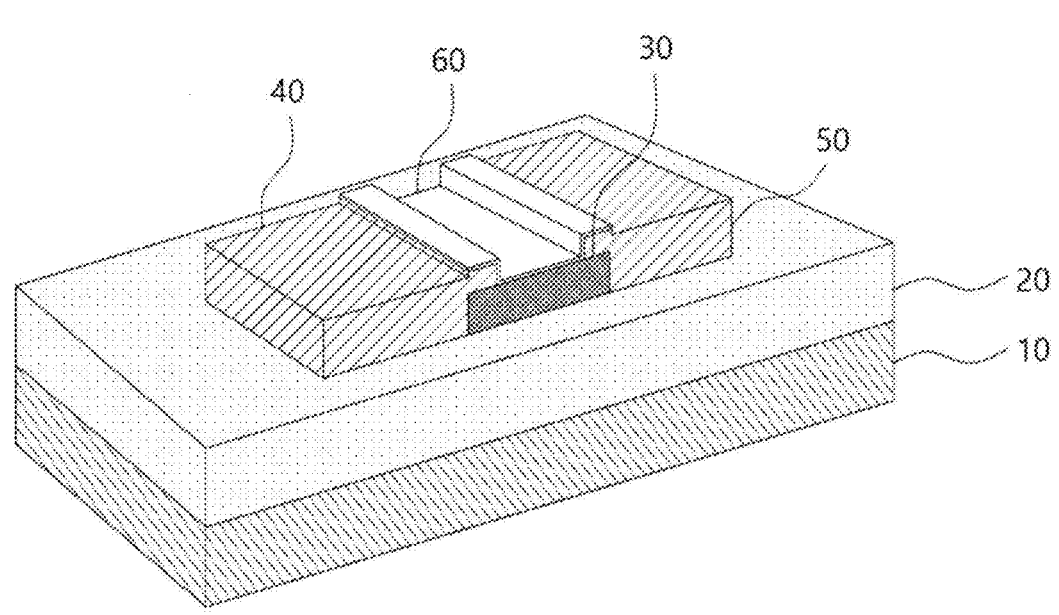
FIG. 1 illustrates a schematic diagram of a thin film transistor according to one embodiment of the present invention.

Unless defined otherwise, all technical and scientific terms used herein have the same meaning as commonly understood by one of ordinary skill in the art to which the present invention belongs. In general, the nomenclature used herein is one well known and commonly used in the art.

In the present specification, when a constituent element such as a substrate or layer is described to be "on" another constituent element, this may include a case in which another constituent element is present therebetween as well as a case directly above the other constituent element.

The present invention relates to a method for manufacturing a tellurium-based semiconductor device, and the manufacturing method of the tellurium-based semiconductor device according to the present invention comprises (i) preparing a substrate: (ii) depositing a tellurium-based semiconductor layer comprising one or more of tellurium and a tellurium oxide on the substrate; and (iii) forming a passivation layer on the tellurium-based semiconductor layer.

In the present specification, a tellurium-based semiconductor is a concept that encompasses tellurium-containing semiconductor materials, such as tellurium, tellurium oxide, and doped or alloyed states thereof with other elements.

According to the present invention, when a tellurium-based semiconductor layer is deposited by using a tellurium-based material as a material for a semiconductor layer and a passivation layer is formed on the tellurium-based semiconductor layer, by using a phenomenon that crystals of hexagonal tellurium in the tellurium-based semiconductor layer are grown by the passivation layer and crystallinity is improved, electrical characteristics of semiconductor devices may be improved. In addition, according to the process of the present invention, heat treatment at a high temperature of 300° C. or higher or cryogenic conditions are not required, and a semiconductor line-friendly process is used.

Hereinafter, each step of the manufacturing method of the tellurium-based semiconductor device according to the present invention will be described in detail.

In the step (i), a type of the substrate is not particularly limited, and the substrate may be a base substrate generally used for manufacturing semiconductor devices. For example, as the substrate, glass, polyethylene naphthalate (PEN), polyethylene terephthalate (PET), polystyrene (PS), polycarbonate (PC), polyimide (PI), polyvinyl chloride (PVC), polyvinylpyrrolidone (PVP), polyethylene (PE), silicon (Si), $SiO_2$, and the like may be used.

Alternatively, the substrate may be an insulating layer formed on a base substrate of a semiconductor device. The insulating layer may be formed of a material with low electrical conductivity used as an interlayer insulating film for general semiconductor devices. For example, the insulating layer may be formed of a silicon oxide, a silicon nitride, a hafnium oxide, an aluminum oxide, a tungsten oxide, a tantalum oxide, a titanium oxide, a ruthenium oxide, or the like, or may be formed of an insulating polymer. For example, when the manufacturing method of the present invention is applied to forming a thin film transistor, the substrate may be a silicon oxide film formed on the surface of a silicon wafer.

In the step (ii), a tellurium-based semiconductor layer is formed by depositing a tellurium-based semiconductor material comprising one or more of tellurium and a tellurium oxide on the substrate.

The tellurium-based semiconductor material may comprise at least one of tellurium and tellurium oxide, and may specifically comprise Te, $TeO_2$, or both. That is, in the tellurium-based semiconductor material, the tellurium atom may be in a state of Te as it is with an oxidation number of 0 (expressed as Te or $Te^0$), a state having an oxidation number of +4 by configuring $TeO_2$ ($Te^{4+}$), or a state in which Te and $Te^{4+}$ are mixed.

These tellurium-based semiconductor materials may be composed of 5p orbitals in which the maximum energy level of the valence band originates from the $Te^0$ state, so that they may provide high mobility compared to conventionally known p-type oxide semiconductors having the maximum energy level in the valence band composed of 2p orbitals of oxygen.

In the present invention, a metal in a positive oxidation state, for example, one or more metals having an oxidation number of +2, +3, or +4 may be added to the tellurium-based semiconductor layer as a dopant or in the form of alloy, thereby controlling the density of holes. For example, Sn, Al, Sb, Hf, La, Y, Zr, Zn, or a combination thereof may be added to the tellurium-based semiconductor layer as a dopant or in the form of alloy.

Deposition of the tellurium-based semiconductor layer may be performed by various deposition techniques used in the art. Specifically, known deposition techniques such as sputtering, chemical vapor deposition, thermal evaporation deposition, E-beam evaporation deposition, and atomic layer deposition may be used, of which sputtering is the most preferred. For example, the tellurium-based semiconductor layer of the present invention may be deposited by using reactive sputtering in which tellurium is used as a target in a vacuum chamber and argon gas, which is a carrier gas, and oxygen gas, which is a reactive gas, are injected.

In the present invention, deposition of the tellurium-based semiconductor layer may be performed at a temperature of 0 to 150° C., preferably 20 to 100° C., and more preferably room temperature to 80° C. According to the present invention, it is possible to provide a semiconductor device having excellent physical properties even without using a cryogenic or high temperature process, thereby solving the problem of conventional tellurium deposition being performed at a cryogenic temperature.

In one embodiment of the present invention, the deposition of the tellurium-based semiconductor layer may be performed under the condition that the oxygen partial pressure is 2 to 23%, preferably 5 to 15%, and more preferably 7 to 10%. The partial pressure of oxygen is defined as a percentage of the pressure of oxygen gas relative to the pressure of the total gas injected during the deposition process. Generally, as the oxygen partial pressure injected in the deposition process of the tellurium-based semiconductor material increases, the surface roughness of the deposited layer decreases, improving transmittance and energy band gap, while crystallinity deteriorates, and electrical characteristics such as a field mobility and a current on/off ratio tend to be deteriorated. In the present invention, it is found that when the tellurium-based semiconductor material is deposited under the oxygen partial pressure conditions in the above range and the passivation layer is formed thereon, the crystallinity and electrical characteristics are not lowered or partially increased while taking advantage of the oxygen injection.

In the step (ii), a state in which an additional post-process is not performed after depositing the tellurium-based semiconductor layer is referred to as "as-deposited". In the as-deposited state, it may be in a mixed state of crystalline and amorphous, for example, a mixed state of hexagonal Te and amorphous $TeO_2$.

Specifically, in the tellurium-based semiconductor layer before forming a passivation layer to be described later, some of the tellurium atoms may be in a Te state, and other some may be in a $Te^{4+}$ state, and the Te and $Te^{4+}$ ($TeO_2$) may be present in a ratio of 40:60 to 78:22 based on the tellurium atom ratio.

The method of the present invention may further comprise the step of heat-treating the tellurium-based semiconductor layer after the step (ii). By the heat-treatment, the crystallinity of the tellurium-based semiconductor layer increases, the amorphous ratio decreases, and electrical characteristics such as an electric field mobility and a current on/off ratio are improved.

The heat-treatment may be performed at a temperature of about 50 to 250° C., preferably about 100 to 200° C., and more preferably 130 to 170° C. in an air, oxygen, or vacuum atmosphere. The heat-treatment may be performed for about 30 minutes to 2 hours, preferably about 50 minutes to 90 minutes. Conventionally, when forming the semiconductor layer, the heat-treatment is performed at a high temperature of 300° C. or higher, but in the present invention, even when the heat-treatment is performed at a lower temperature than that of the conventional art, it is possible to provide the semiconductor layer with improved crystallinity and electrical characteristics, so that it may be easily applied to 3D semiconductor manufacturing technology.

In one embodiment of the present invention, a thickness of the formed tellurium-based semiconductor layer may be 40 nm or less, preferably 1 to 20 nm, and more preferably 2 to 7 nm. Generally, when the thickness of the semiconductor layer is thin, there are advantages in that the current on/off ratio is excellent and the downsizing of the semiconductor device is advantageous, but there is a problem that the electric field mobility and on-current (a current when a voltage is applied) may be reduced. However, in the present invention, it can be confirmed that when the tellurium-based semiconductor layer is deposited in the above range, it not only shows an excellent current on/off ratio due to its thin thickness, but also overcomes the decrease in electric field mobility and on-current due to oxygen injection during the deposition process.

The tellurium-based semiconductor layer has a two-dimensional p-type semiconductor characteristic, and may be used as a channel layer of a thin film transistor described later, and may also be used as a channel layer of a photo transistor, an active layer of a photodetector, an active layer of a gas sensor, and the like, but is not limited thereto.

In the step (iii), the passivation layer serves to protect and stabilize the semiconductor layer and is formed to cover the semiconductor layer, and when there is another layer adjacent to the semiconductor layer, it is formed to cover a portion thereof together. For example, in the thin film transistor, the passivation layer may be formed to cover a semiconductor layer exposed between a drain electrode and a source electrode, and may be formed to cover portions of the drain electrode and the source electrode together. In this case, the passivation layer may also serve to insulate a metal wire.

According to the present invention, the crystallinity of the tellurium-based semiconductor layer may be improved by forming the passivation layer on the semiconductor layer, so that a semiconductor device with a high electric field mobility and high current on/off ratio may be manufactured. Specifically, in the tellurium-based semiconductor layer before the passivation layer is formed, semiconducting Te and amorphous $TeO_2$ exist in a mixed form, and after the passivation layer is formed, the crystallinity of the hexagonal Te is improved, and amorphous $TeO_2$ in the tellurium-based semiconductor layer is reduced to hexagonal Te, resulting in improved crystallinity of the tellurium-based semiconductor layer. Accordingly, after forming the passivation layer, the tellurium-based semiconductor layer may be in a mixed state of crystalline and amorphous or a crystalline state. This improvement in crystallinity is presumed to be due to crystal growth as interfacial energy is stabilized through the formation of the passivation layer.

From this point of view, the tellurium-based semiconductor layer after the passivation layer is formed may comprise $Te^o$ and $Te^{4+}$ ($TeO_2$) at a ratio of 70:30 to 99:1, preferably 80:20 to 90:10 based on the tellurium atomic ratio.

In one embodiment of the present invention, the passivation layer may comprise a metal oxide such as $Al_2O_3$, $HfO_2$, $ZrO_2$, $Ta_2O_5$, $La_2O_3$, $Y_2O_3$, or a combination of the above metal oxides such as $AlHfO_x$, $HfZrO_x$, $AlZrO_x$, among which $Al_2O_3$, $HfO_2$, and $ZrO_2$ are preferred and $Al_2O_3$ is most preferred.

In the present invention, the passivation layer may be formed by various deposition techniques used in the art. Specifically, known deposition techniques such as atomic layer deposition, chemical vapor deposition, thermal vacuum deposition, sputtering, and electron beam deposition may be used, and among them, atomic layer deposition may be preferably used. The deposition of the passivation layer may be performed at about 50 to 250° C., preferably about 100 to 200° C., and more preferably 130 to 170° C. in an air, oxygen, or vacuum atmosphere.

In the present invention, a thickness of the passivation layer may be 50 nm or less, preferably 1 to 30 nm, and more preferably 5 to 15 nm. When the thickness of the passivation layer is too thin, it is not sufficient to protect the semiconductor layer from external moisture or foreign substances, so that the electrical characteristics of the device may be deteriorated. Conversely, when the thickness is too thick, stress applied to the device may increase, resulting in deterioration of device performance.

The present invention also relates to a tellurium-based semiconductor device manufactured by the method.

The tellurium-based semiconductor device according to the present invention comprises a substrate; a tellurium-based semiconductor layer positioned on the substrate; and a passivation layer positioned on the tellurium-based semiconductor layer.

In the tellurium-based semiconductor device according to the present invention, a description of the substrate is the same as that of the manufacturing method, so a detailed description thereof will be omitted.

In the tellurium-based semiconductor device according to the present invention, the tellurium-based semiconductor layer has improved crystallinity by the passivation layer and has different physical properties from the tellurium-based semiconductor layer in the step (ii) of the manufacturing method. The tellurium-based semiconductor layer of the tellurium-based semiconductor device according to the present invention may be in a mixed state of crystalline and amorphous or in a crystalline state.

Specifically, the tellurium-based semiconductor layer may comprise Te and $Te^{4+}$ at an atomic ratio of 80:20 to 90:10.

In the tellurium-based semiconductor device according to the present invention, a thickness of the tellurium-based semiconductor layer may be 40 nm or less, preferably 1 to 20 nm, and more preferably 2 to 7 nm. Generally, when the thickness of the semiconductor layer is thin, there are advantages of the excellent the current on/off ratio and the downsizing of the semiconductor device, but there is a problem that the electric field mobility and on-current may be reduced. However, in the present invention, when the thickness of the tellurium-based semiconductor layer is in the above range, it may not only show an excellent current on/off ratio, but also overcome the decrease in electric field mobility and on-current due to oxygen injection during the deposition process.

In the tellurium-based semiconductor device according to the present invention, a description of the passivation layer is the same as that of the manufacturing method, so a detailed description thereof will be omitted.

The present invention also relates to a thin film transistor comprising the tellurium-based semiconductor device.

The thin film transistor is a constituent element of an electronic circuit made of semiconductors, and serves to control flow of a current. Main constituent elements of the thin film transistor are a substrate, a gate electrode, a gate insulating layer, a source electrode, a drain electrode, an active layer forming a semiconductor channel, and a passivation layer, and it is driven by a principle of moving electrons from the source electrode to the drain electrode through the semiconductor channel by applying a voltage to the gate electrode. In the present invention, the tellurium-based semiconductor layer may be used as the active layer forming the semiconductor channel of the thin film transistor.

FIG. 1 illustrates a schematic diagram of a thin film transistor according to one embodiment of the present invention.

Referring to FIG. 1, a thin film transistor according to one embodiment of the present invention comprises a substrate 10; an insulating layer 20 positioned on the substrate 10; a tellurium-based semiconductor layer 30 positioned on the insulating layer 20; a source electrode 40 and a drain electrode 50 positioned on the tellurium-based semiconductor layer 30; and a passivation layer 60. In this case, the source electrode 40 and the drain electrode 50 are disposed to be spaced apart from each other at both end portions of the tellurium-based semiconductor layer 30. The passivation layer 60 may be formed to cover the tellurium-based semiconductor layer 30, and may also be formed to partially cover the source electrode 40 and the drain electrode 50.

In the thin film transistor, as the substrate, a silicon (Si) wafer, glass, polyethylene naphthalate (PEN), polyethylene terephthalate (PET), polystyrene (PS), polycarbonate (PC), polyimide (PI), polyvinyl chloride (PVC), polyvinylpyrrolidone (PVP), polyethylene (PE), or the like may be used. The substrate may act as a gate electrode, or a gate electrode may be separately provided on the substrate.

For example, a gate electrode (not shown) may be positioned on the substrate. The gate electrode serves to control a current between the semiconductor channels, and is formed to extend in one direction on the substrate. As the gate electrode, a conductive metal such as aluminum, chromium, copper, tantalum, titanium, molybdenum, tungsten, or an alloy thereof, a metal oxide transparent electrode such as an indium tin oxide (ITO), or a polycrystalline silicon may be used.

The insulating layer may serve to separate the gate electrode and the semiconductor channel, and may be formed of a silicon oxide, a silicon nitride, a silicon oxynitride, aluminum oxide, an aluminum oxynitride, a hafnium oxide, a zirconium oxide, or the like, and may be formed of a high dielectric material (high-k) with a large dielectric constant as other materials.

The tellurium-based semiconductor layer is the active layer of the thin film transistor, and configures the semiconductor channel for moving electrons between the source electrode and the drain electrode. A description of the tellurium-based semiconductor layer is the same as that described above in the description of the tellurium-based semiconductor device, so a detailed description thereof will be omitted.

The source electrode is an electrode that supplies electrons, and the drain electrode is an electrode that receives electrons, and they may use a conductive metal such as aluminum, neodymium, silver, chromium, titanium, tantalum, molybdenum, or an alloy thereof, or a metal oxide transparent electrode such as an indium tin oxide (ITO).

The passivation layer is a layer that serves to protect the tellurium-based semiconductor layer and improve the crystallinity of the tellurium-based semiconductor layer. A description of the passivation layer is the same as that described in the description of the manufacturing method of the tellurium-based semiconductor device, so a detailed description thereof will be omitted.

The thin film transistor shown in FIG. 1 has a bottom gate/top contact structure, but the structure of the thin film transistor is not limited thereto, and a thin film transistor having a bottom gate/bottom contact structure, a top gate/top contact structure, or a top gate/bottom contact structure may also be implemented. In the top gate structure, the tellurium-based semiconductor layer may be positioned below the gate electrode and may be disposed to overlap the gate electrode, while in the bottom contact structure, the source/drain electrodes may be positioned below the tellurium-based semiconductor layer to be electrically connected to the tellurium-based semiconductor layer.

The thin film transistor according to the present invention is a p-type thin film transistor, and may configure a complementary TFT circuit, for example, an inverter together with an n-type thin film transistor. In this case, a CMOS device may be configured by using an oxide semiconductor material such as a ZnO, an IZO, an IGO, or an IGZO as an n-type thin film transistor. In addition, the p-type thin film transistor may be used as a switching element electrically connected to a pixel electrode of an organic light emitting diode or a liquid crystal display, or it may be used as a switching element electrically connected to one electrode of a memory device, for example, one electrode of a resistive-switching random access memory (RRAM), a phase-change random access memory (PRAM), or a magnetic random access memory (MRAM).

Examples

Hereinafter, the present invention will be described in more detail through examples. However, these examples show some experimental methods and compositions to illustratively explain the present invention, and the scope of the present invention is not limited to these examples.

Manufacturing Example 1: Manufacturing of Thin Film Transistor Comprising Tellurium-Based Semiconductor Layer A p-type Si wafer, which was a gate electrode, was thermally oxidized to grow a 100 nm-thick $SiO_2$ layer serving as a gate insulating layer on the p-type Si wafer.

A shadow mask was disposed on the $SiO_2$ layer, and a $TeO_x$ thin film having a thickness of about 4 nm was deposited through sputtering at room temperature by using a Te target while supplying oxygen as a reaction gas and argon (Ar) as a carrier gas into a chamber. The sputtering was performed under the conditions of input power of 50 W and process pressure of 2 mTorr, and the oxygen partial pressure was controlled to 9%.

A shadow mask was disposed on the $TeO_x$ thin film and an electrode pattern was deposited under an Ar atmosphere to form source/drain electrodes (ITO) at both end portions of the $TeO_x$ thin film.

After that, the $TeO_x$ thin film was heat treated at 150° C. for 1 hour, and an $Al_2O_3$ layer having a thickness of 10 nm was formed on the $TeO_x$ thin film exposed between the source/drain electrodes at 150° C. by using atomic layer deposition, so that a thin film transistor comprising a tellurium-based semiconductor layer was manufactured.

Experimental Example 1: Transmission Electron Microscopy (TEM) Image Analysis

TEM image analysis was performed to confirm the crystallinity of the tellurium-based semiconductor layer.

TEM images of an as-deposited tellurium-based semiconductor layer before heat treatment (a), a tellurium-based semiconductor layer after heat treatment (b), and a tellurium-based semiconductor layer after forming a passivation layer thereon (c) in Manufacturing Example 1 are shown in FIG. 2 and FIGS. 3A to 3C.

Figure 2:
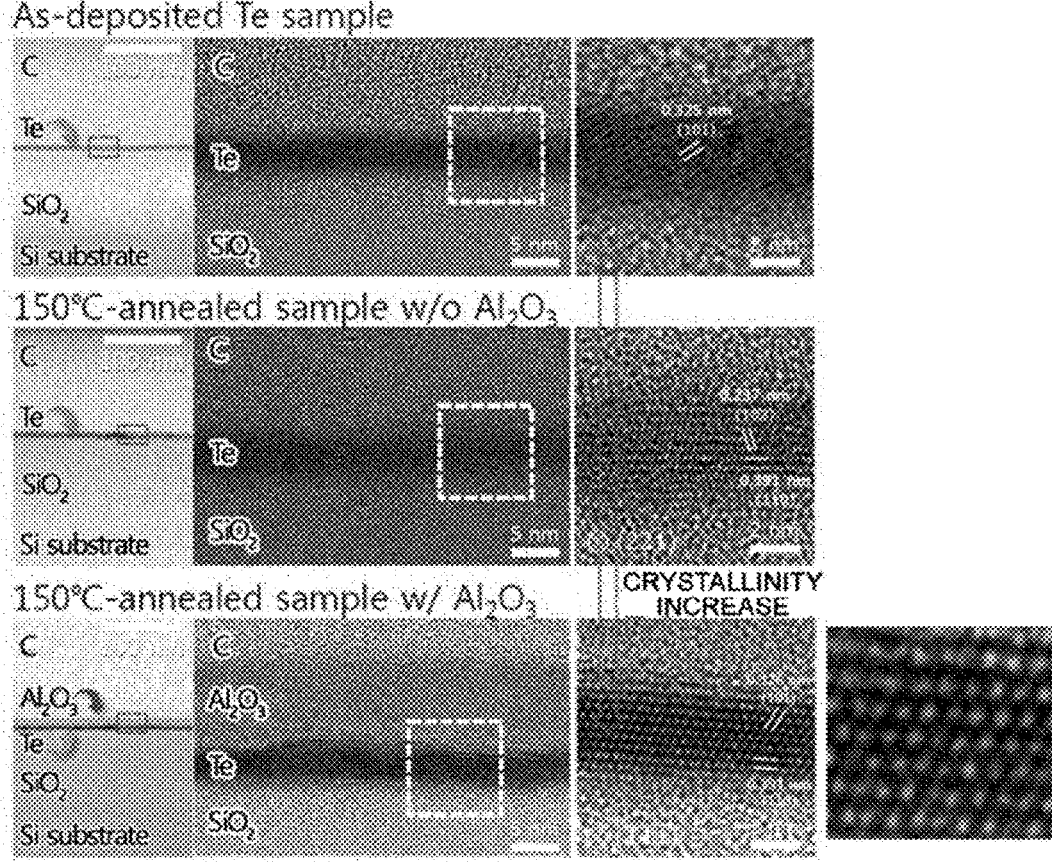
FIG. 2 illustrates a transmission electron microscopy (TEM) image of a thin film transistor according to one embodiment of the present invention.

Referring to FIG. 2, in the case of the heat treatment after the deposition, it was confirmed that the crystallinity of hexagonal Te increased in the tellurium-based semiconductor layer compared to the as-deposited one, and in the case of forming the passivation layer thereon, the crystallinity thereof was further improved. It is presumed that the increase in the crystallinity of hexagonal Te by the formation of the passivation layer is related to the crystal growth resulting from the stabilization of the interfacial energy.

Figure 3A:
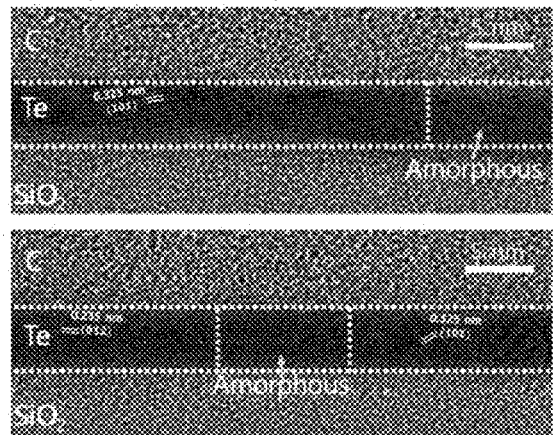
FIGS. 3A to 3C illustrate another TEM image of a thin film transistor according to one embodiment of the present invention.
Figure 3B:
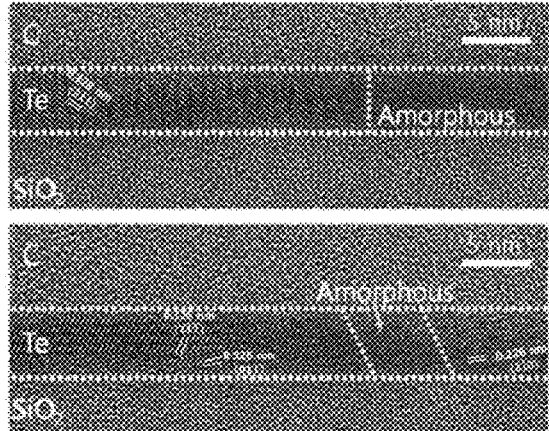
Figure 3C:
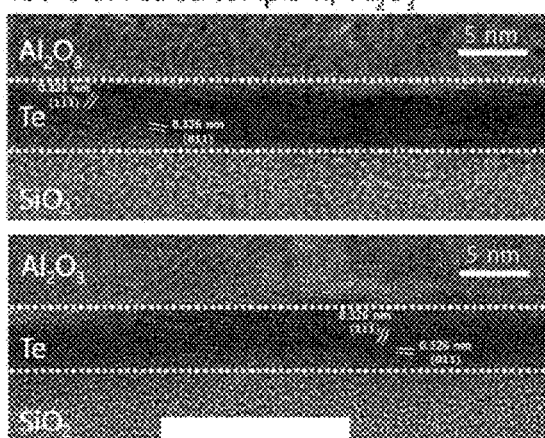

Referring to FIGS. 3A to 3C, when the tellurium-based semiconductor layer was the as-deposited or only heat treatment was performed after deposition, a mixture of semiconducting Te and amorphous $TeO_2$ was observed, but when the passivation layer was formed thereon, amorphous $TeO_2$ was not observed. Therefore, it was confirmed that amorphous $TeO_2$ was reduced to hexagonal Te (two-dimensional Te, tellurene) by the formation of the passivation layer, and growth of metastable hexagonal Te was promoted compared to $TeO_2$.

Through these results, it can be seen that the crystallinity of hexagonal Te in the tellurium-based semiconductor layer is grown by heat treatment after deposition and the crystallinity is improved, and the crystallinity may be further improved when a passivation layer is formed thereon.

Experimental Example 2: Electrical Characteristic Measurement 2-1. Electrical Transmission Characteristic In order to confirm the transmission characteristic of the thin film transistor of Manufacturing Example 1, mobility ($\mu_{FE,Lin}$, $\mu_{FE,Sat}$) and current turn-off ratio ($I_{ON/OFF}$) were measured while setting a voltage $V_{DS}$ between the drain and source electrodes to $-0.1$ V and $-10$ V, respectively, and the results are shown in FIG. 4B. For comparison, the same measurement was performed on the thin film transistor in which no passivation layer was formed on the tellurium-based semiconductor layer, and the results are shown in FIG. 4A.

Figure 4A:
FIGS. 4A and 4B illustrate an electrical transmission characteristic depending on a drain-source voltage ($V_{DS}$) of a thin film transistor according to one embodiment of the present invention.
Figure 4A:
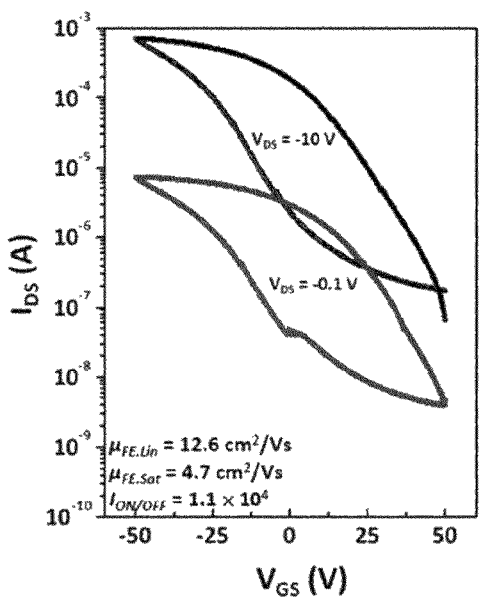
Figure 4B:
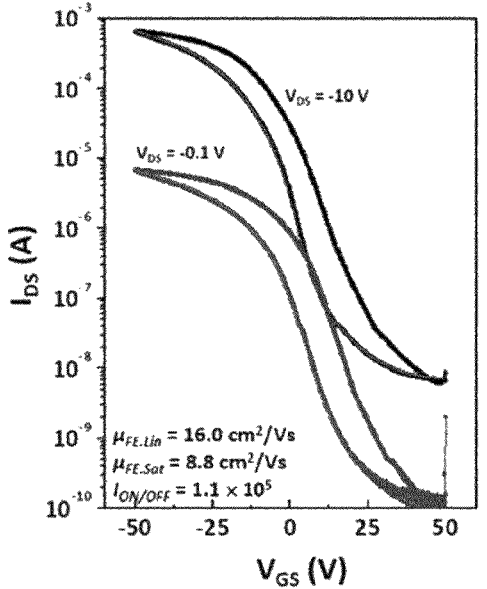

Referring to FIGS. 4A and 4B, when the passivation layer was formed on the tellurium-based semiconductor layer, the electric field mobility $\mu_{FE,Lin}$ increased from 12.6 $cm^2$/Vs to 16.0 $cm^2$/Vs and $\mu_{FE,Sat}$ increased from 4.7 $cm^2$/Vs to 8.8 $cm^2$/Vs and the current on/off ratio increased from $1.1 \times 10^4$ to $1.1 \times 10^5$, compared to when it is not.

In addition, the hysteresis phenomenon was controlled from about 40 V to about 10 V, and the subthreshold was improved at the threshold voltage or less. In addition, it was confirmed that it had characteristics as a p-type thin film transistor, as it is turned on when a negative voltage is applied to the gate electrode.

That is, it was confirmed that a p-type semiconductor having excellent electrical characteristics may be obtained by forming a passivation layer on the tellurium-based semiconductor layer.

2-2. Electrical Output Characteristic

Figure 5A:
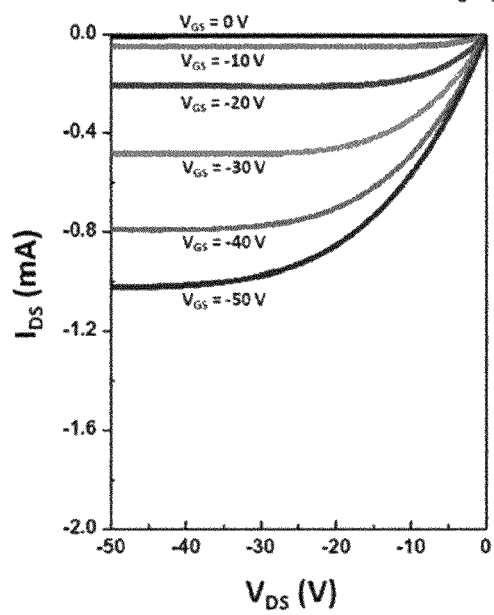
FIGS. 5A and 5B illustrate an electrical transmission characteristic depending on a gate voltage ($V_{GS}$) of a thin film transistor according to one embodiment of the present invention.
Figure 5B:
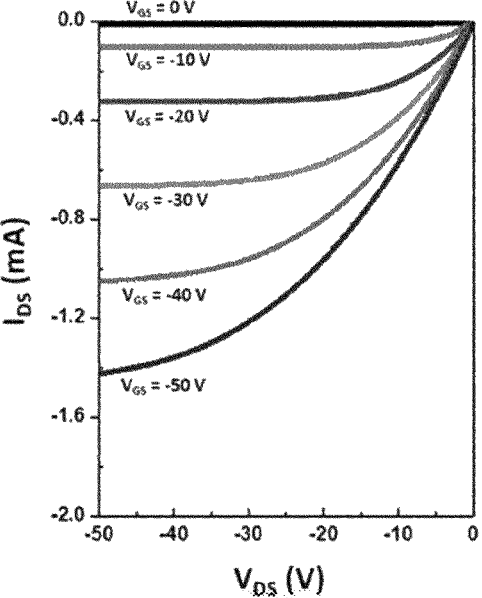

In order to compare the output characteristics of the thin film transistor of Manufacturing Example 1 before and after forming the passivation layer, $I_{DS}$ values with respect to Vas of 0 V, $-10$ V, $-20$ V, $-30$ V, $-40$ V, and $-50$ V were measured and the results were shown FIGS. 5A and 5B.

In FIGS. 5A and 5B, it can be seen that the output characteristics of the transistor in which the passivation layer was formed were improved by about 1.5 times. Therefore, it was confirmed that even in the output characteristics, a higher current value was obtained when the passivation layer was formed.

Manufacturing Example 2: Manufacture of Thin Film Transistor Comprising Tellurium-Based Semiconductor Layer by Controlling Layer Thickness and Oxygen Partial Pressure A p-type Si wafer, which was a gate electrode, was thermally oxidized to grow a $SiO_2$ layer with a thickness of 100 nm, which was a gate insulating layer, on the p-type Si wafer.

A shadow mask was disposed on the $SiO_2$ layer, and $TeO_x$ thin films having a thickness of about 3.5 nm and 9 nm were respectively deposited through sputtering by using a Te target while supplying oxygen as a reaction gas and argon (Ar) as a carrier gas into a chamber. The sputtering was performed under the conditions of input power of 20 W and process pressure of 2 mTorr, and the oxygen partial pressure was controlled to 0%, 9%, 23%, 33% and 50%, respectively.

A shadow mask was disposed on the $TeO_x$ thin film and an electrode pattern was deposited under an Ar atmosphere to form source/drain electrodes (ITO) at both end portions of the $TeO_x$ thin film.

After that, the $TeO_x$ thin film was heat treated at 150° C. for 1 hour, and an $Al_2O_3$ layer having a thickness of 10 nm was formed on the $TeO_x$ thin film exposed between the source/drain electrodes at 150° C. by using atomic layer deposition. Thus, a total of 10 types of thin film transistors manufactured by varying the thickness and oxygen partial pressure of the tellurium-based semiconductor layer were manufactured.

Experimental Example 3: X-Ray Diffraction (XRD) Crystallinity Analysis

Figure 6A:
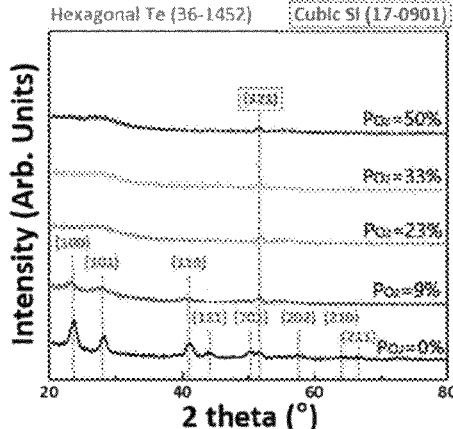
FIGS. 6A to 6C illustrate X-ray diffraction (XRD) analysis results depending on oxygen partial pressure when depositing a tellurium-based semiconductor layer for a thin film transistor according to one embodiment of the present invention.
Figure 6B:
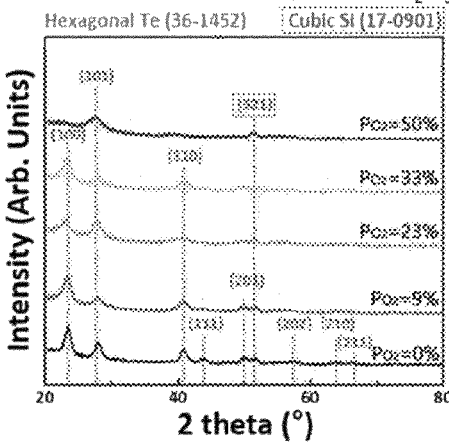
Figure 6C:
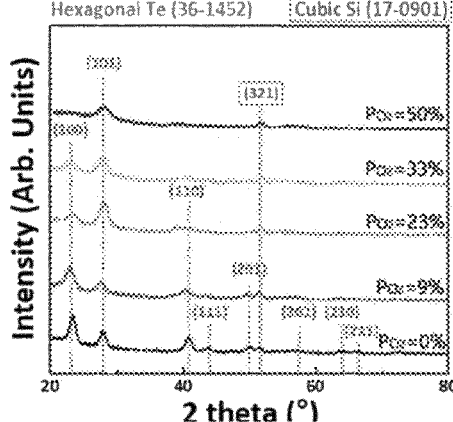

XRD analysis was performed according to the oxygen partial pressure during the process for five types of thin film transistors having the tellurium-based semiconductor layer having the thickness of 3.5 nm in Manufacturing Example 2, and the crystallinity analysis results are shown in FIG. 6C. For comparison, XRD analysis was also performed on the thin film transistor having the as-deposited tellurium-based semiconductor layer and the thin film transistor in which only heat treatment was performed after depositing the tellurium-based semiconductor layer and no passivation layer was formed thereon, and the results are shown in FIGS. 6A and 6B.

Referring to FIG. 6A, when the tellurium-based semiconductor layer was as-deposited and when the oxygen partial pressure was 0%, it was deposited as hexagonal Te. As the oxygen partial pressure increased, the crystallinity decreased, and in particular, it was deposited in an amorphous state at 23% or more.

On the other hand, when heat treatment was performed after depositing the tellurium-based semiconductor layer, or when the passivation layer was formed thereon after heat treatment, a result that the hexagonal Te was grown as compared to the as-deposited state under the same oxygen partial pressure conditions was confirmed.

Through these results, it was confirmed that the crystallinity of the tellurium-based semiconductor layer was improved by the heat treatment after the deposition and the passivation layer formation.

Experimental Example 4: Electrical Transmission Characteristic Analysis

In order to confirm the electrical transmission characteristics of 10 types of thin film transistors of Manufacturing Example 2, the mobility ($\mu_{FE,Lin}$, $\mu_{FE,Sat}$) and the current on/off ratio ($I_{ON/OFF}$) were measured while the voltage VDS between the drain and source electrodes was applied at $-0.1$ V and $-10$ V, respectively. The results are shown in FIG. 7 and FIG. 8, and the specific values are shown in Table 1 below.

TABLE 1

| Te layer thickness | Electrical characteristic | Oxygen partial pressure | | | | |
|---|---|---|---|---|---|---|
| | | 0% | 9% | 23% | 33% | 50% |
| 9 nm | $\mu_{FE,Lin}$ (cm$^2$/Vs) | 21.5 | 12.1 | 2.8 | 4.3 | 0.1 |
| | $\mu_{FE,Sat}$ (cm$^2$/Vs) | 10.8 | 3.7 | 6.6 | 1.8 | 0.04 |
| | $I_{ON/OFF}$ | $2.0 \times 10^2$ | $4.7 \times 10^2$ | $1.1 \times 10^3$ | $1.8 \times 10^3$ | $1.2 \times 10^3$ |
| 3.5 nm | $\mu_{FE,Lin}$ (cm$^2$/Vs) | 5.9 ± 0.3 | 10.2 ± 1.1 | 2.5 ± 0.1 | 0.7 ± 0.1 | — |
| | $\mu_{FE,Sat}$ (cm$^2$/Vs) | 3.6 ± 0.1 | 6.5 ± 0.7 | 1.6 ± 0.0 | 0.6 ± 0.1 | — |
| | $I_{ON/OFF}$ | $(1.1 ± 0.1) \times 10^5$ | $(1.1 ± 0.1) \times 10^5$ | $(1.0 ± 0.1) \times 10^5$ | $(7.0 ± 0.1) \times 10^4$ | — |

Figure 7:
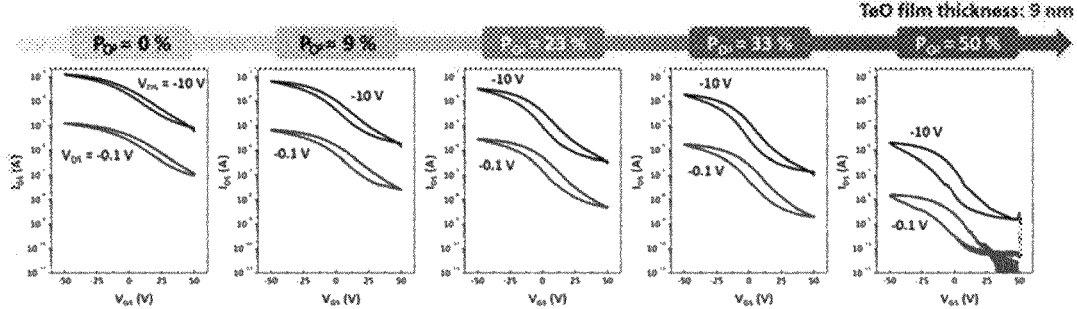
FIG. 7 illustrates electrical transmission characteristics depending on oxygen partial pressure of a tellurium-based semiconductor layer having a thickness of 9 nm in a thin film transistor according to one embodiment of the present invention.
Figure 8:
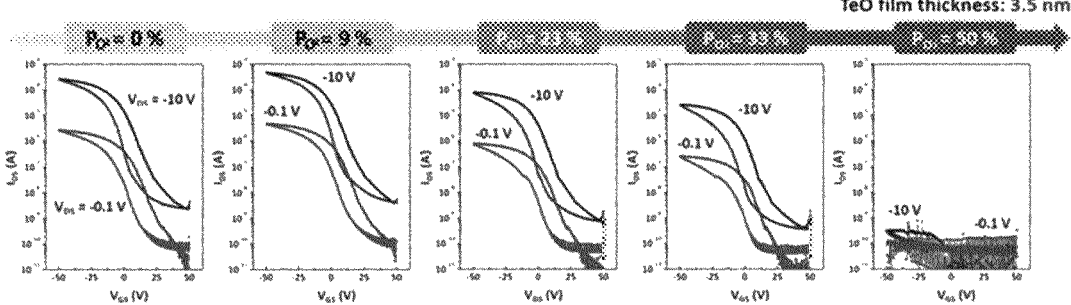
FIG. 8 illustrates electrical transmission characteristics depending on oxygen partial pressure of a tellurium-based semiconductor layer having a thickness of 3.5 nm in a thin film transistor according to another embodiment of the present invention.

Referring to FIG. 7 and Table 1, in the case of a thin film with a thickness of 9 nm, the current on/off ratio increased as the oxygen partial pressure increased, and the on-current and mobility tended to decrease. This result is presumed to be due to a decrease in intercalation of tellurium 5p orbitals according to an increase in oxygen 2p orbitals in the valence band maximum (VBM), which is a hole moving path.

On the other hand, in FIG. 8, the thickness 3.5 nm thin film showed an increased on-current and mobility when the oxygen partial pressure was 9% than when it was 0%. In addition, compared to the 9 nm thin film, the current on/off ratio of the 3.5 nm thin film was excellent about 10 to 103 times. In other words, the 3.5 nm thin film showed excellent current on/off ratio due to its thin thickness, and when deposited under the condition of 9% oxygen partial pressure, it overcame the problem of electric field mobility and on-current degradation due to oxygen injection during the process.

In addition, comparing the results of FIG. 8 with FIG. 4, which is the results of electrical transmission characteristics of Experimental Example 2, it was confirmed that the on-current current and the mobility decreased as the input power of sputtering decreased from 50 W to 20 W during the manufacturing of the thin film transistor.

As above, specific features of the content of the present invention have been described in detail, for those skilled in the art, these specific descriptions are only preferred embodiments, and it is apparent that the scope of the present invention is not limited thereby. Accordingly, the substantial scope of the present invention should be defined by the appended claims and their equivalents.

The invention claimed is:

1. A method for manufacturing a tellurium-based semiconductor device, comprising:

(i) preparing a substrate;

(ii) depositing a tellurium-based semiconductor layer comprising Te and TeO$_2$ on the substrate; and (iii) forming a passivation layer on the tellurium-based semiconductor layer.

2. The method for manufacturing the tellurium-based semiconductor device of claim 1, wherein the substrate comprises an insulating layer thereon.

3. The method for manufacturing the tellurium-based semiconductor device of claim 1, wherein the tellurium-based semiconductor layer further comprises at least one metal selected from the group consisting of Sn, Al, Sb, Hf, La, Y, Zr, and Zn as a dopant or in the form of alloy.

4. The method for manufacturing the tellurium-based semiconductor device of claim 1, wherein the deposition of the tellurium-based semiconductor layer is performed by sputtering, chemical vapor deposition, thermal vacuum deposition, electron beam deposition, or atomic layer deposition.

5. The method for manufacturing the tellurium-based semiconductor device of claim 1, wherein the deposition of the tellurium-based semiconductor layer is performed under an oxygen partial pressure condition of 5 to 15%.

6. The method for manufacturing the tellurium-based semiconductor device of claim 1, wherein a thickness of the tellurium-based semiconductor layer is 2 to 7 nm.

7. The method for manufacturing the tellurium-based semiconductor device of claim 1, further comprising, after the step (ii), performing heat treatment at 100 to 200° C.

8. The method for manufacturing the tellurium-based semiconductor device of claim 1, wherein the passivation layer comprises at least one selected from the group consisting of Al$_2$O$_3$, HfO$_2$, ZrO$_2$, Ta$_2$O$_5$, La$_2$O$_3$, Y$_2$O$_3$, AlHfO$_x$, HfZrO$_x$, and AlZrO$_x$.

9. The method for manufacturing the tellurium-based semiconductor device of claim 1, wherein the formation of the passivation layer is performed by atomic layer deposition, chemical vapor deposition, thermal vacuum deposition, sputtering, or electron beam deposition.

10. The method for manufacturing the tellurium-based semiconductor device of claim 1, wherein the formation of the passivation layer is performed at a temperature of 100 to 200° C.

11. The method for manufacturing the tellurium-based semiconductor device of claim 1, wherein a thickness of the passivation layer is 1 to 30 nm.

12. A tellurium-based semiconductor device manufactured by the method of claim 1, comprising:

a substrate;

a tellurium-based semiconductor layer positioned on the substrate; and a passivation layer positioned on the tellurium-based semiconductor layer.

13. The tellurium-based semiconductor device of claim 12, wherein the tellurium-based semiconductor layer comprises Te and Te$^{4+}$ at an atomic ratio of 80:20 to 90:10.

14. A thin film transistor comprising the tellurium-based semiconductor device of claim 12.

\* \* \* \* \*